US012117243B2

(12) United States Patent
Inagaki et al.

(10) Patent No.: US 12,117,243 B2
(45) Date of Patent: Oct. 15, 2024

(54) VAPOR CHAMBER

(71) Applicant: Furukawa Electric Co., Ltd., Tokyo (JP)

(72) Inventors: Yoshikatsu Inagaki, Tokyo (JP); Kenya Kawabata, Tokyo (JP); Hirofumi Aoki, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 340 days.

(21) Appl. No.: 17/571,432

(22) Filed: Jan. 7, 2022

(65) Prior Publication Data
US 2022/0128314 A1 Apr. 28, 2022

Related U.S. Application Data

(63) Continuation of application No. PCT/JP2021/002196, filed on Jan. 22, 2021.

(30) Foreign Application Priority Data

Jan. 31, 2020 (JP) ................................ 2020-015656

(51) Int. Cl.
*F28D 15/04* (2006.01)
(52) U.S. Cl.
CPC ..................................... *F28D 15/04* (2013.01)
(58) Field of Classification Search
CPC ................................ F28F 3/12; H01L 23/427
See application file for complete search history.

(56) References Cited

U.S. PATENT DOCUMENTS

| | | | |
|---|---|---|---|
| 2001/0022219 | A1 | 9/2001 | Ikeda et al. |
| 2002/0023742 | A1 | 2/2002 | Dussinger et al. |
| 2005/0051307 | A1 | 3/2005 | Dussinger et al. |
| 2006/0000579 | A1 | 1/2006 | Whitney et al. |
| 2006/0032615 | A1 | 2/2006 | Dussinger et al. |
| 2006/0181858 | A1 | 8/2006 | Kamemoto |
| 2006/0243425 | A1 | 11/2006 | Dussinger et al. |
| 2007/0294892 | A1 | 12/2007 | Yang et al. |

(Continued)

FOREIGN PATENT DOCUMENTS

| | | |
|---|---|---|
| CN | 1822758 A | 8/2006 |
| CN | 204217285 U | 3/2015 |

(Continued)

OTHER PUBLICATIONS

Notice of Examination Opinion for Taiwanese Patent Application No. 110102995 dated May 22, 2023, pp. all.

(Continued)

*Primary Examiner* — Emmanuel E Duke
(74) *Attorney, Agent, or Firm* — Dorsey & Whitney LLP

(57) ABSTRACT

The disclosure provides a vapor chamber that has excellent fixing stability of a wick structure inside a container and also has excellent circulation properties for a liquid-phase working fluid due to excellent capillary force of the wick structure. The vapor chamber includes a container in which a cavity portion is formed by one plate-shaped body and another plate-shaped body facing the one plate-shaped body, a working fluid enclosed in the cavity portion, and a wick structure contained in the cavity portion and welded to the container so that a welded portion is formed in the wick structure.

9 Claims, 2 Drawing Sheets

(56) References Cited

U.S. PATENT DOCUMENTS

| | | |
|---|---|---|
| 2009/0308574 A1 | 12/2009 | Liu et al. |
| 2014/0360701 A1 | 12/2014 | Aoki et al. |
| 2017/0138673 A1 | 5/2017 | Aoki et al. |
| 2018/0313615 A1 | 11/2018 | Nakamura et al. |
| 2019/0021188 A1 | 1/2019 | Phan et al. |
| 2019/0024984 A1 | 1/2019 | Aoki et al. |
| 2020/0045848 A1 | 2/2020 | Wakaoka et al. |
| 2021/0095930 A1 | 4/2021 | Inagaki et al. |

FOREIGN PATENT DOCUMENTS

| | | | |
|---|---|---|---|
| CN | 107205330 A | | 9/2017 |
| CN | 209605636 U | | 11/2019 |
| CN | 209643211 U | | 11/2019 |
| CN | 110530184 A | | 12/2019 |
| JP | H07193380 A | | 7/1995 |
| JP | H10126075 A | | 5/1998 |
| JP | H11237193 A | | 8/1999 |
| JP | 2002544469 A | | 12/2002 |
| JP | 2004037001 A | | 2/2004 |
| JP | 2004095684 A | | 3/2004 |
| JP | 2008505304 A | | 2/2008 |
| JP | 2013174376 A | | 9/2013 |
| JP | 2014109401 A | | 6/2014 |
| JP | 2016035348 A | | 3/2016 |
| JP | 2017110891 A | | 6/2017 |
| JP | 2018162949 A | | 10/2018 |
| JP | 2018185094 A | | 11/2018 |
| JP | 2018189349 A | | 11/2018 |
| JP | 2019082264 A | * | 5/2019 |
| JP | 2019116990 A | | 7/2019 |
| JP | 2019207076 A | | 12/2019 |
| TW | I291540 B | | 12/2007 |
| TW | I294325 B | | 3/2008 |
| TW | I395918 B | | 5/2013 |
| WO | 9953254 A1 | | 10/1999 |
| WO | 2017104819 A1 | | 6/2017 |
| WO | 2017150356 A1 | | 9/2017 |
| WO | 2018199217 A1 | | 11/2018 |
| WO | WO-2019230385 A1 * | 12/2019 | ......... F28D 15/0233 |

OTHER PUBLICATIONS

Notice of Reasons for Refusal for Japanese Patent Application No. 2022-084822 mailed May 30, 2023, pp. all.

Notice of Reasons for Refusal for Japanese Patent Application No. 2022-084823 mailed on May 30, 2023, pp. all.

International Search Report and Written Opinion (English Translation for ISR only) mailed on Mar. 9, 2021 for PCT Application No. PCT/JP2021/002196.

[English Translation] Notice of Opinion on Examination dated Apr. 22, 2022 for Taiwanese Patent Application No. 110102998; pp. all.

[English Translation] Notice of Opinion on Examination dated on Apr. 22, 2022 for Taiwanese Patent Application No. 110102995; pp. all.

U.S. Appl. No. 17/571,407 titled "Vapor Chamber" filed Jan. 7, 2022; pp. all pages of application as filed.

Notice of Reasons for Refusal mailed on Dec. 14, 2021 for Japanese Patent Application No. 2020-15655, with English translation; pp. all.

International Search Report and Written Opinion (English Translation for ISR only) mailed on Mar. 9, 2021 for PCT Application No. PCT/JP2021/002196; pp. all.

International Search Report and Written Opinion (English Translation for ISR Only) mailed on Mar. 9, 2021 for PCT Application No. PCT/JP2021/002195; pp. all.

Notice of Reasons for Refusal dated Mar. 28, 2022 in the Japanese application No. 2020-15655 with English translation; pp. all.

U.S. Appl. No. 17/501,407 titled "Vapor Chamber" filed Jan. 7, 2022, App. all pages of the application as filed.

[English Translation] Decision of Rejection dated Dec. 2, 2022 in TW application No. 110102995; pp. all.

[English Translation] Decision of Rejection mailed Nov. 3, 2022 in TW Application No. 110102998; pp. all.

* cited by examiner

VAPOR CHAMBER

CROSS REFERENCE TO RELATED APPLICATIONS

The present application is a continuation application of International Patent Application No. PCT/JP2021/002196 filed on Jan. 22, 2021, which claims the benefit of Japanese Patent Application No. 2020-015656, filed on Jan. 31, 2020. The contents of these applications are incorporated herein by reference in their entirety.

BACKGROUND

Technical Field

The present disclosure relates to a vapor chamber in which a wick structure is stably fixed in a predetermined position and excellent capillary force of the wick structure provides excellent flowability for a liquid-phase working fluid.

Background

Amounts of heat generated by electronic components such as semiconductor elements mounted on electric/electronic devices have been increased due to high-density mounting and the like involved in enhanced functionality, and cooling of the electronic components has recently become more important. Additionally, heating elements such as electronic components may be disposed in narrow spaces due to miniaturization of electronic devices. As a method of cooling a heating element such as an electronic component disposed in a narrow space, a vapor chamber or a plane-shaped heat pipe may be used, for example. Further, the area of a region necessary to be cooled may be increased due to the enhanced functionality of electronic devices, and accordingly, an increased area of a vapor chamber, a plane-shaped heat pipe, and the like may be required.

As a vapor chamber that has facilitated flowability for a working fluid and is provided with a wick structure, a vapor chamber has been proposed which includes an upper plate, a lower plate, a plurality of side walls disposed between the upper plate and the lower plate, a container closed by the upper plate, the lower plate, and the plurality of side walls, and a wick structure that is contained in the container and is in contact with the upper plate and the lower plate (International Publication No. WO 2017/104819). The wick structure has a plurality of first wick portions each of which extends from a first terminal thereof located in a vaporization portion to the side walls and has a linear portion, and a second wick portion that connects second terminals of the plurality of first wick portions to each other. According to International Publication No. WO 2017/104819, since the plurality of first wick portions have the linear portions, a flow path of a gas-phase working fluid extends straight up to a low-temperature portion located away from the vaporization portion so that a flow path, through which the gas-phase working fluid passes from the vaporization portion toward the low-temperature portion, is shortened. Accordingly, the gas-phase working fluid can quickly move to the low-temperature portion, and thus the heat transfer efficiency can be increased.

However, in International Publication No. WO 2017/104819, the wick structure is fixed in the container by holding between the upper plate and the lower plate of the container. Therefore, the wick structure may deviate in position from a heat receiving portion of the container depending on the installation posture of the vapor chamber and the like. When the wick structure deviates in position from the heat receiving portion of the container, the liquid-phase working fluid may not be sufficiently circulated to the heat receiving portion of the container, and consequently the vapor chamber may not exert sufficient heat transfer properties. In particular, when an increased area of the vapor chamber is required, there is room for improvement in prevention of the positional deviation of the wick structure, that is, in fixing stability of the wick structure.

From this regard, in order to prevent the positional deviation of the wick structure inside the container, the wick structure may be joined to the container with a joining material such as a brazing material or solder. However, when the wick structure is joined to the container with such a joining material, the joining material enters a capillary structure of the wick structure and capillary force of the wick structure is reduced. Therefore, there is room for improvement in circulation properties of the wick structure.

SUMMARY

The present disclosure is related to providing a vapor chamber that has excellent fixing stability of a wick structure inside a container and also has excellent circulation properties for a liquid-phase working fluid due to excellent capillary force of the wick structure.

Outlines of components of the present disclosure are as follows.

[1] A vapor chamber including:
- a container in which a cavity portion is formed by one plate-shaped body and another plate-shaped body facing the one plate-shaped body;
- a working fluid enclosed in the cavity portion; and
- a wick structure contained in the cavity portion and welded to the container so that a welded portion is formed in the wick structure.

[2] The vapor chamber according to [1], wherein the welded portion is a welded portion that is formed by at least one spot welding selected from the group consisting of resistance spot welding in which an electrode is applied for welding and laser spot welding in which a laser beam is applied for welding.

[3] The vapor chamber according to [1] or [2], wherein a side surface of the wick structure is located at an interval X from an inner peripheral surface of the container that faces the side surface of the wick structure, and the interval X is greater than 0% and 5% or less of a dimension of the wick structure in a direction parallel to the interval X.

[4] The vapor chamber according to any one of [1] to [3], wherein a plurality of the welded portions are formed.

[5] The vapor chamber according to any one of [1] to [4], wherein a peripheral portion of the one plate-shaped body that is located outside the cavity portion and a peripheral portion of the other plate-shaped body that is located outside the cavity portion are joined by welding with a fiber laser so that the container is formed.

[6] The vapor chamber according to any one of [1] to [5], wherein the wick structure has a mesh member made of metal.

[7] The vapor chamber according to any one of [1] to [6], wherein the mesh member is a mesh member made of stainless steel.

In the vapor chamber, the wick structure is joined and fixed to the container by welding to the container. From the above, the welded portion is formed in the wick structure, and the welded portion exists in the wick structure as a weld mark. The wick structure is welded to the container, and thereby contact portions between the wick structure and the container and contact portions between fine members forming the wick structure are melted, and then the wick structure is joined to the container. When the wick structure is joined to the container, in regions other than the above-mentioned contact portions, melting of the fine members forming the wick structure is suppressed and melting of the container is also suppressed.

In the present specification, "a main surface of the wick structure" means a surface extending along the plane direction of the container, that is, the plane direction of the one plate-shaped body and the other plate-shaped body. "A side surface of the wick structure" means a surface of the wick structure in the thickness direction of the wick structure.

According to an aspect of the present disclosure, since the wick structure is joined to the container by welding, the vapor chamber having excellent fixing stability of the wick structure inside the container can be obtained. Therefore, according to the vapor chamber of the present disclosure, positional deviation of the wick structure from the heat receiving portion of the container can be prevented. Additionally, according to an aspect of the present disclosure, since the wick structure is joined to the container by welding, the wick structure is joined to the container in a state in which contact portions between the wick structure and the container and contact portions between the fine members forming the wick structure are melted and, in regions other than the above-mentioned contact portions, both melting of the wick structure and melting of the container are suppressed. Further, when the wick structure is joined to the container, it is not necessary to use a joining material. Therefore, according to the vapor chamber of the present disclosure, since a joining material such as a brazing material and solder can be prevented, in joining, from entering a porous structure of the wick structure that generates capillary force, the wick structure has excellent capillary force and excellent circulation properties for the liquid-phase working fluid even though being joined to the container.

According to an aspect of the present disclosure, since the welded portion is a welded portion that is formed by at least one spot welding selected from the group consisting of resistance spot welding and laser spot welding, a joining material such as a brazing material or solder can be more securely prevented from entering a porous structure of the wick structure that generates capillary force, and thus circulation properties of the wick structure for the liquid-phase working fluid is securely improved.

According to an aspect of the present disclosure, since a side surface of the wick structure is located at an interval X from an inner peripheral surface of the container that faces the side surface and the interval X is greater than 0% and 5% or less of a dimension of the wick structure in a direction parallel to the interval X, sealing properties between the one plate-shaped body and the other plate-shaped body can be prevented from impairing due to the wick structure, and also the liquid-phase working fluid is sufficiently circulated to the heat receiving portion so that dry-out of the vapor chamber can be reliably prevented, and thus cooling properties of the vapor chamber and circulation properties for the liquid-phase working fluid are surely improved.

According to an aspect of the present disclosure, since a plurality of the welded portions are formed, fixing stability of the wick structure inside the container is further improved and positional accuracy of the wick structure inside the container is also improved.

Since a peripheral portion of the container is sealed by fiber laser welding, joining strength between the one plate-shaped body and the other plate-shaped body is improved so that excellent sealing properties can be provided to the container, and a heat load to the container is prevented in joining the one plate-shaped body and the other plate-shaped body so that excellent mechanical strength can be provided to the container.

According to an aspect of the present disclosure, since the wick structure has a mesh member made of metal, melting is facilitated only in contact portions between wire-like members that are fine members forming the wick structure and contact portions between the wire-like members and the container, and thus fixing stability of the wick structure inside the container can be obtained, and also the wick structure can exert more excellent capillary force.

DETAILED DESCRIPTION

Figure 1:
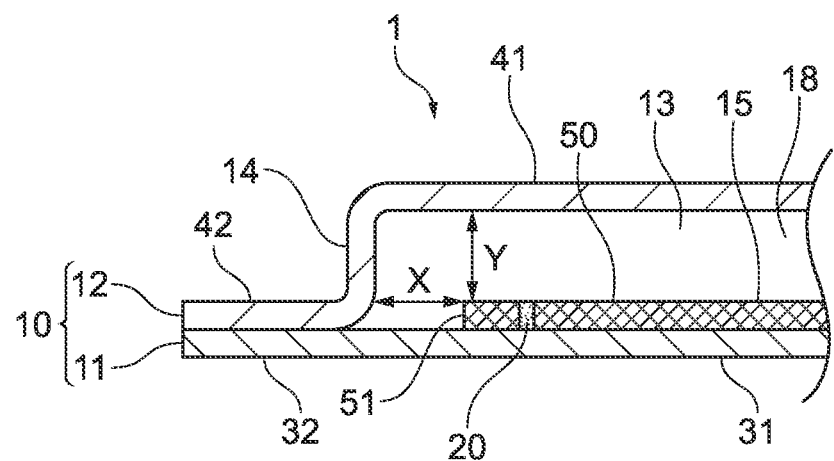
FIG. 1 is an explanatory view of a side cross section of a vapor chamber according to an exemplary embodiment of the present disclosure.
Figure 2:
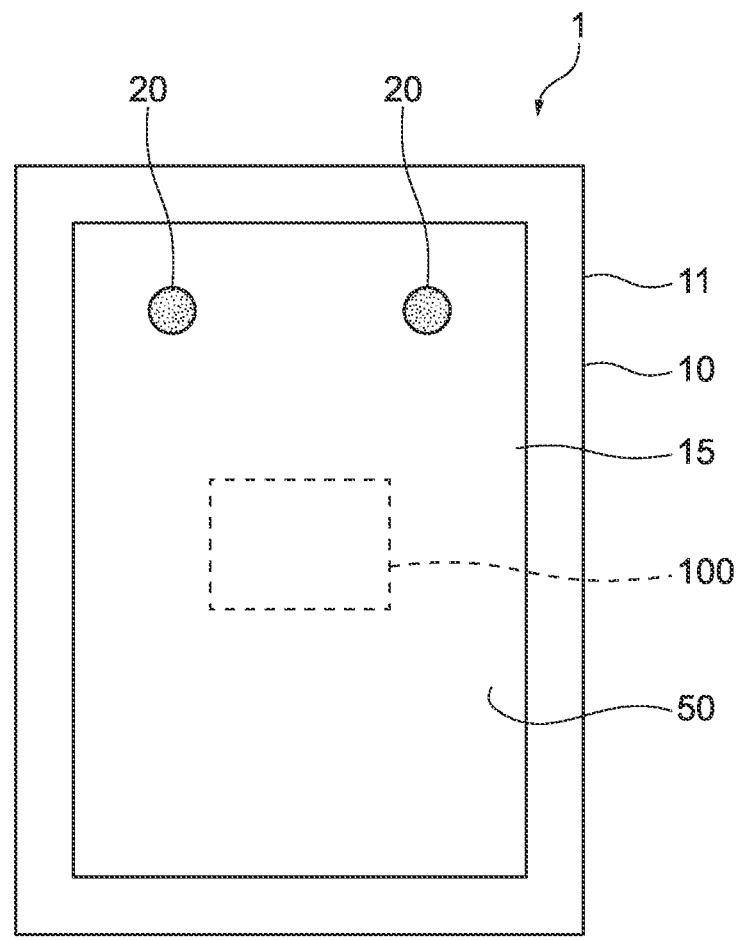
FIG. 2 is a plan view illustrating the inside of the vapor chamber according to the exemplary embodiment of the present disclosure.
Figure 3:
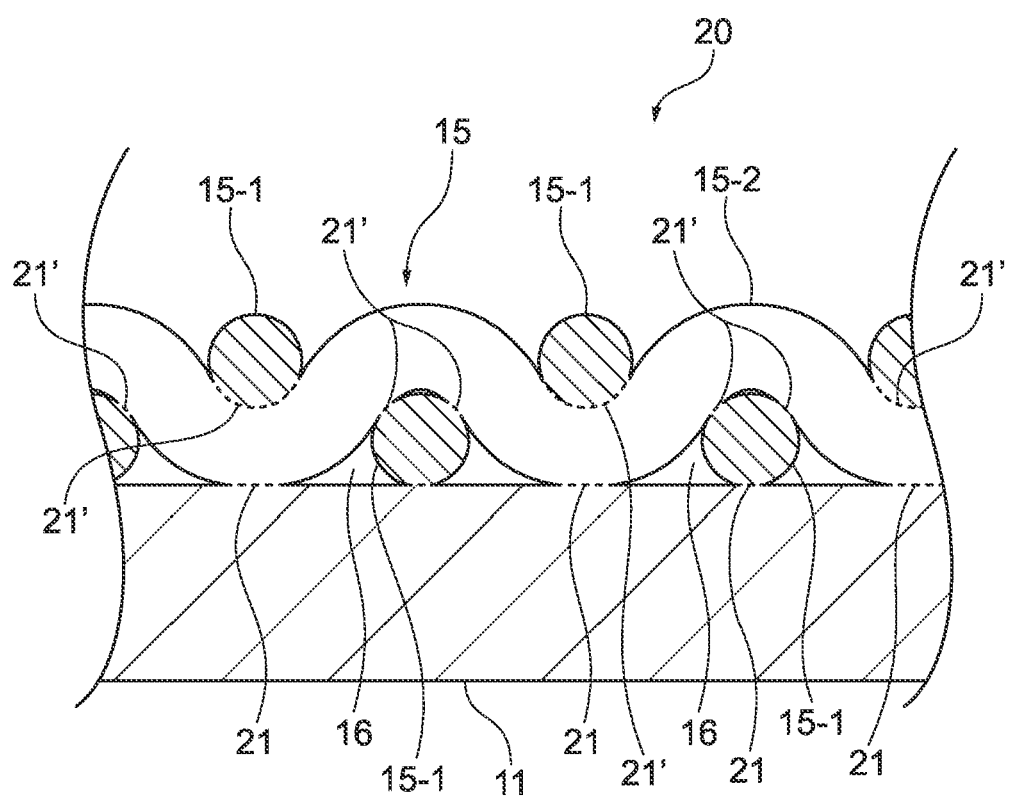
FIG. 3 is an explanatory view of welded portions of a wick structure of the vapor chamber according to the exemplary embodiment of the present disclosure.

Hereinafter, a vapor chamber according to an exemplary embodiment of the present disclosure will be described with reference to the accompanying drawings. FIG. 1 is an explanatory view of a side cross section of a vapor chamber according to an exemplary embodiment of the present disclosure. FIG. 2 is a plan view illustrating the inside of the vapor chamber according to the exemplary embodiment of the present disclosure. FIG. 3 is an explanatory view illustrating welded portions of a wick structure of the vapor chamber according to the exemplary embodiment of the present disclosure.

As illustrated in FIG. 1, a vapor chamber 1 according to the exemplary embodiment of the present disclosure has a container 10 that is of a planar type in which a cavity portion 13 is formed by superposing two plate-shaped bodies facing each other, that is, one plate-shaped body 11 and another plate-shaped body 12 facing the one plate-shaped body 11, and a working fluid (not illustrated) enclosed in the cavity portion 13. In the internal space of the cavity portion 13, a wick structure 15 having a capillary structure is contained. A space between the inner surface of the other plate-shaped body 12 and the wick structure 15 serves as a vapor flow path 18 through which the gas-phase working fluid flows.

The one plate-shaped body 11 generally has a flat plate shape including a central portion 31 and a peripheral portion 32 located outside the central portion 31. Although the other plate-shaped body 12 also has a plate shape, a central portion 41, excluding a peripheral portion 42, is plastically deformed in a protruding shape. In the other plate-shaped body 12, the central portion 41 has a flat plate shape, and the peripheral portion 42 located outside the central portion 41 also has a flat plate shape. The central portion 41 of the other plate-shaped body 12 that protrudes outward and is plastically deformed in a protruding shape is a protruding part 14 of the container 10, and the inside of the protruding part 14 is the cavity portion 13. Therefore, the position of the peripheral portion of the container 10 is on the outside of the cavity portion 13, and the peripheral portion 32 of the one plate-shaped body 11 and the peripheral portion 42 of the other plate-shaped body 12 are located in this position. The cavity portion 13 is decompressed by deaeration.

The wick structure 15 is a member that is contained in the cavity portion 13 and generates capillary force. The wick structure 15 is porous and thus has a capillary structure. Further, the wick structure 15 is a planar member and extends along the plane of the container 10 that is of a planar type. In the vapor chamber 1, the wick structure 15 is a body separate from the container 10, that is, a different member from the container 10. The wick structure 15 extends on the inner surface of the one plate-shaped body 11 in surface contact with the inner surface of the one plate-shaped body 11. A main surface 50 of the wick structure 15 is exposed to the cavity portion 13.

The wick structure 15 is not particularly limited as long as having a structure that generates capillary force, and may include a structure having a member such as a mesh made of metal, a braided body of metal wires, and a filament body of metal wires. A material of the wick structure 15 can be appropriately selected depending on usage conditions, and may include stainless steel, copper, copper alloys, iron, ferroalloys, aluminum, aluminum alloys, nickel, and nickel alloys, for example. Among these materials, stainless steel is preferable because it has light weight and mechanical strength and is easily welded to the container 10. In the vapor chamber 1, a mesh member made of stainless steel is used as the wick structure 15.

As illustrated in FIGS. 1 and 2, the wick structure 15 is welded to the inner surface of the container 10. In the vapor chamber 1, the wick structure 15 is welded to the inner surface of the one plate-shaped body 11. A heating element 100, which is an object to be cooled by the vapor chamber 1, is thermally connected to the outer surface of the one plate-shaped body 11. In FIG. 2, the heating element 100 is thermally connected to the central portion of the outer surface of the one plate-shaped body 11.

Since the wick structure 15 is welded to the inner surface of the one plate-shaped body 11, a welded portion 20, which is a weld mark, is formed in the wick structure 15. The welded portion 20 extends in the thickness direction of the wick structure 15 and reaches the inner surface of the one plate-shaped body 11 from the main surface 50. The wick structure 15 is welded to the inner surface of the container 10, and thereby joined and fixed to the inside of the container 10. In the vapor chamber 1, the wick structure 15 is welded to the inner surface of the container 10 in a plurality of areas (two areas in FIG. 2). Therefore, in the wick structure 15, the welded portions 20 exist in a plurality of areas (two areas in FIG. 2) on the main surface 50. Although a position of the welded portion 20 is not particularly limited, in the vapor chamber 1, the welded portion 20 is formed in a peripheral portion of the wick structure 15. That is, in plan view, the welded portion 20 is formed in a region that does not overlap with a region to which the heating element 100 is thermally connected. In the present specification, "plan view" means a state which is visually recognized from the vertical direction relative to the plane of the vapor chamber 1.

The welded portion 20 is a welded portion formed by spot welding, for example. A method of forming the welded portion 20 by spot welding includes resistance spot welding in which the one plate-shaped body 11 and a wick structure 15 are superposed to form a laminated body and electrodes are applied to both sides of the laminated body for welding, and laser spot welding in which a laser beam is applied to one side of the laminated body for welding, for example.

As illustrated in FIG. 3, in the vapor chamber 1, the welded portion 20 is formed in the wick structure 15 by welding such as resistance spot welding and laser spot welding, and thereby contact portions 21 between the wick structure 15 and the container 10 and contact portions 21' between metal wires 15-1 extending in a first direction and metal wires 15-2 extending in a second direction, the metal wires forming the wick structure 15, are melted and united. On the other hand, in regions other than the contact portions 21, 21', the wick structure 15 is joined to the container 10 with both melting of the metal wires 15-1, 15-2 and melting of the container 10 being suppressed. In the vapor chamber 1, when the wick structure 15 is joined to the container 10, it is not necessary to additionally use a joining material such as a brazing material and solder. Therefore, in the vapor chamber 1, a joining material such as a brazing material and solder can be prevented from entering fine voids 16 in the wick structure 15 that generate capillary force. From the above, in the vapor chamber 1, a decrease in capillary force in the welded portion 20 of the wick structure 15 can be prevented even though the wick structure 15 is joined to the container 10.

In the vapor chamber 1, welded portion 20 is formed in the wick structure 15 by welding such as resistance spot welding and laser spot welding, and thereby excellent joining strength can be provided between the wick structure 15 and the container 10. In the vapor chamber 1, the welded portion 20 is formed by resistance spot welding.

As illustrated in FIG. 1, although a position in which the wick structure 15 is fixed is not particularly limited, a side surface 51 of the wick structure 15 is preferably located at a predetermined interval X from an inner peripheral surface of the container 10 that faces the side surface 51 of the wick structure 15, for example. The predetermined interval X between the side surface 51 of the wick structure 15 and the inner peripheral surface of the container 10 allows sealing properties of the cavity portion 13 to be prevented from impairing due to the existence of the wick structure 15 when the peripheral portion 32 of the one plate-shaped body 11 and the peripheral portion 42 of the other plate-shaped body 12 are joined to seal the cavity portion 13. The lower limit of the interval X is preferably greater than 0% and particularly preferably 1% of the dimension of the wick structure 15 in the direction parallel to the interval X in terms of reliably facilitating sealing work for the cavity portion 13. The upper limit of the interval X is preferably 5% and particularly preferably 4% of the dimension of the wick structure 15 in the direction parallel to the interval X in terms of sufficiently circulating the liquid-phase working fluid to the heat receiving portion to reliably prevent dry-out of the vapor chamber 1.

Although an average thickness of the wick structure 15 is not particularly limited, the main surface 50 of the wick structure 15 that is exposed to the cavity portion 13 is preferably located at a predetermined interval Y from an inner surface of the container 10 that faces the main surface 50, for example. The predetermined interval Y between the main surface 50 of the wick structure 15 and the inner surface of the container 10 allows the vapor flow path 18 of the gas-phase working fluid to be reliably secured, and consequently flow properties for the gas-phase working fluid are improved. The lower limit of the interval Y is preferably 0.7 mm and particularly preferably 0.9 mm in terms of more reliably securing the vapor flow path 18 of the gas-phase working fluid to further improve the flow properties for the gas-phase working fluid. The upper limit of the interval Y is preferably 1.3 mm and particularly preferably 1.1 mm in terms of sufficiently securing the volume of the wick structure 15 to smoothly circulate the liquid-phase working fluid to the heat receiving portion. In the vapor chamber 1, the value of Y is approximately 1.0 mm.

A thickness of the wick structure 15 may be 0.02 mm to 0.20 mm, for example. When a mesh member is used as the wick structure 15, the thickness of the wick structure 15 can be adjusted by superposing one or more sheet-shaped mesh members in the thickness direction according to demand, for example by laminating a plurality of sheet-shaped mesh members or by bending one sheet-shaped mesh member. In the vapor chamber 1, one sheet-shaped mesh member is laid in a planar manner almost all over the inner surface of the central portion 31 of the one plate-shaped body 11 as the wick structure 15.

A shape of the container 10 in plan view is not particularly limited, and can be appropriately selected depending on usage conditions of the vapor chamber 1 and the like, for example, including a circular shape, a long fence shape, and a polygonal shape. As illustrated in FIG. 2, the vapor chamber 1 has a quadrangular shape.

A material of the container 10 may include stainless steel, copper, aluminum, titanium, copper alloys, aluminum alloys, and titanium alloys, for example. These materials may be used independently or in combination of two or more materials. The material of the container 10 may be the same as or different from the material of the wick structure 15. When the material of the container 10 and the material of the wick structure 15 are the same, the material of the wick structure 15 may be stainless steel and the material of the container 10 may also be stainless steel, for example.

A thickness of the vapor chamber 1 may be 0.2 mm to 1.0 mm, for example. Average thicknesses of the one plate-shaped body 11 and the other plate-shaped body 12 may be the same, and may each be 0.05 mm to 0.1 mm, for example. The average thicknesses of one plate-shaped body 11 and the average thickness of the other plate-shaped body 12 may be different. When the average thickness of the one plate-shaped body 11 is larger than the average thickness of the other plate-shaped body 12, the deformation of the one plate-shaped body 11 is prevented and thermal connectivity between the container 10 and the heating element 100 is improved.

When the whole circumferences of the peripheral portions 32, 42 are joined with the peripheral portion 32 of the one plate-shaped body 11 and the peripheral portion 42 of the other plate-shaped body 12 being superposed on each other, the container 10, which is a closed container, is formed and the cavity portion 13 is sealed. A method of joining the peripheral portions 32, 42 is not particularly limited, and may include diffusion joining, brazing, laser welding, ultrasonic welding, friction joining, and pressure joining, for example. Among these methods, laser welding is preferable in terms of excellent productivity and sealing properties of the container 10. Laser welding with a fiber laser is particularly preferable in that joining strength between the one plate-shaped body 11 and the other plate-shaped body 12 is improved so that excellent sealing properties can be provided to the container 10 and also a heat load to the container 10 is prevented in joining the one plate-shaped body 11 and the other plate-shaped body 12 so that excellent mechanical strength can be provided to the container 10.

Although a joining width of the peripheral portions 32, 42 is not particularly limited, it may be 1.0 mm to 4.0 mm, for example.

The working fluid enclosed in the cavity portion 13 can be appropriately selected depending on compatibility with the material of the container 10, and may include water, for example, and further include alternative freon, fluorocarbons, cyclopentane, ethylene glycol, a mixture of such fluids and water, and the like.

Next, operation of the vapor chamber 1 according to the exemplary embodiment of the present disclosure will be described with reference to the FIGS. 1 and 2. In the vapor chamber 1, a region that is thermally connected to the heating element 100 (a region in which the heating element 100 is in contact with the container 10) functions as a heat receiving portion. When the vapor chamber 1 receives heat from the heating element 100, the liquid-phase working fluid enclosed in the cavity portion 13 undergoes a phase change from liquid to gas in the heat receiving portion, and the gas-phase working fluid that has undergone the phase change flows through the vapor flow path 18 to move from the heat receiving portion to a heat discharging portion (a region located at a predetermined interval away from the contact portion between the heating element 100 and the container 10) of the vapor chamber 1. The gas-phase working fluid that has moved from the heat receiving portion to the heat discharging portion discharges latent heat in the heat discharging portion, and undergoes a phase change from gas to liquid. The latent heat discharged in the heat discharging portion is further discharged to the external environment of the vapor chamber 1. The working fluid that has undergone the phase change from gas to liquid in the heat discharging portion is circulated from the heat discharging portion to the heat receiving portion by capillary force of the wick structure 15 welded to the container 10.

Next, a method of manufacturing the vapor chamber 1 according to the exemplary embodiment of the present disclosure will be described. In the vapor chamber 1, the wick structure 15 is first placed on a central portion of the inner surface of the one plate-shaped body 11, and the wick structure 15 is welded and fixed to the inner surface of the one plate-shaped body 11 by welding means such as spot welding. The one plate-shaped body 11 on which the wick structure 15 is mounted and the other plate-shaped body 12 in which the central portion 41, excluding the peripheral portion 42, is plastically deformed in a protruding shape are then superposed to laminate the peripheral portion 32 of the one plate-shaped body 11 and the peripheral portion 42 of the other plate-shaped body 12. At this time, the one plate-shaped body 11 and the other plate-shaped body 12 are superposed so that the wick structure 15 is contained in the central portion 41 of the other plate-shaped body 12 that is plastically deformed in a protruding shape. Subsequently, the peripheral portion 32 of the one plate-shaped body 11 and the peripheral portion 42 of the other plate-shaped body 12 are welded to each other in the circumferential direction excluding a region that is to be formed into a liquid injection port, and thereby the container 10 having the cavity portion 13 is formed. The working fluid is then injected from the liquid injection port into the cavity portion 13, and the cavity portion 13 is deaerated and decompressed. After that, the liquid injection port is sealed, and thereby the vapor chamber 1 can be manufactured.

In the vapor chamber 1, since the wick structure 15 is joined to the container 10 by welding, fixing stability of the wick structure 15 inside the container 10 is excellent. Therefore, according to the vapor chamber 1, positional deviation of the wick structure 15 from the heat receiving portion of the container 10 can be prevented, and thus a sufficient amount of the liquid-phase working fluid can be reliably circulated to the heat receiving portion. Additionally, in the vapor chamber 1, since the wick structure 15 is joined to the container 10 by welding, a joining material such as a brazing material or solder can be prevented from entering the capillary structure of the wick structure 15 in joining, and thus the wick structure 15 has excellent capillary force and excellent circulation properties for the liquid-phase working fluid even though being joined to the container.

In the vapor chamber 1, since the welded portion 20 is a welded portion that is formed by at least one spot welding selected from the group consisting of resistance spot welding and laser spot welding, a joining material such as a brazing material or solder can be securely prevented, in joining, from entering the capillary structure of the wick structure 15 that generates capillary force, and thus the circulation properties for the liquid-phase working fluid of the wick structure 15 is further improved. Further, in the vapor chamber 1, since a plurality of welded portions 20 are formed, the fixing stability of the wick structure 15 inside the container 10 is further improved and also the positional accuracy of the wick structure inside the container 10 is improved.

In the vapor chamber 1, since the wick structure 15 is a mesh member made of metal, melting is facilitated only in contact portions between the metal wires 15-1, 15-2 that are fine members forming the wick structure 15 and contact portions between the metal wires 15-1, 15-2 and the container 10. Therefore, the fixing stability of the wick structure 15 inside the container 10 can be obtained, and the wick structure 15 can exert more excellent capillary force.

Next, another exemplary embodiment of a vapor chamber according to the present disclosure will be described. In the vapor chamber 1, the central portion 41 of the other plate-shaped body 12 has a flat plate shape. Alternatively, a plurality of recessed parts may be provided in the outer surface of the other plate-shaped body 12 to form a plurality of support portions that maintain the decompressed internal space of the cavity portion 13. In this case, the plurality of support portions are convexly provided in the inner surface of the other plate-shaped body 12 corresponding to the cavity portion 13 side. Further, head sections of the support portions are preferably in contact with the main surface 50 of the wick structure 15 in terms of securely maintaining the internal space of the cavity portion 13.

In the vapor chamber 1, one sheet-shaped mesh member is laid in a planar manner almost all over the inner surface 21 of the central portion 31 of the one plate-shaped body 11 as the wick structure 15. Alternatively, in the heat receiving portion of the one plate-shaped body 11 to which the heating element 100 is thermally connected, an aspect may be taken in which a plurality of sheet-shaped mesh members are superposed and laminated, as the wick structure 15. In this case, in regions other than the heat receiving portion, the wick structure 15 may be one sheet-shaped mesh member. That is, an aspect may be taken in which the thickness of the wick structure 15 in the heat receiving portion is larger than the thickness of the wick structure 15 in the regions other than the heat receiving portion. Since a plurality of sheet-shaped mesh members are superposed in the heat receiving portion of the one plate-shaped body 11, the capillary force and the storage amount of the liquid-phase working fluid of the wick structure 15 in the heat receiving portion are further improved, and thus dry-out in the heat receiving portion can be securely prevented even if the amount of heat generated by the heating element 100 increases.

In the vapor chamber 1, the wick structure 15 is welded to the container 10 in two areas, and the welded portions 20 are formed in two areas. Alternatively, the wick structure 15 may be welded to the container 10 in three or more areas, and the welded portions 20 may be formed in three or more areas.

The vapor chamber according to the present disclosure has excellent fixing stability of the wick structure inside the container and also has excellent circulation properties for the liquid-phase working fluid due to excellent capillary force of the wick structure. Therefore, the vapor chamber can be used in various fields, and has high utility value, for example, in the field related to cooling of electronic components mounted on highly functional electronic devices such as portable information terminals and personal computers including 2 in 1 tablets and the like.

What is claimed is:

1. A vapor chamber comprising:
   a container in which a cavity portion is formed by one plate-shaped body and another plate-shaped body facing the one plate-shaped body;
   a working fluid enclosed in the cavity portion; and
   a wick structure contained in the cavity portion and welded to the container so that a welded portion is formed in the wick structure,
   wherein
   the wick structure is welded to the container, and thereby contact portions between the wick structure and the container and contact portions between fine members forming the wick structure are melted, and then the wick structure is joined to the container,
   the wick structure extends on an inner surface of the one plate-shaped body in surface contact with the inner surface of the one plate-shaped body, and the working fluid that has undergone a phase change from gas to liquid in a heat discharging portion is circulated from the heat discharging portion to a heat receiving portion only by capillary force of the wick structure, and
   the wick structure has a mesh member made of metal, and with first metal wires extending in a first direction and second metal wires extending in a second direction, the metal wires being the fine members forming the wick structure, contact portions between the wick structure and the container and contact portions between the first metal wires and the second metal wires are melted and united.

2. The vapor chamber according to claim 1, wherein the welded portion is a welded portion that is formed by at least one spot welding selected from the group consisting of resistance spot welding in which an electrode is applied for welding and laser spot welding in which a laser beam is applied for welding.

3. The vapor chamber according to claim 2, wherein a side surface of the wick structure is located at an interval X from an inner peripheral surface of the container that faces the side surface of the wick structure, and the interval X is greater than 0% and 5% or less of a dimension of the wick structure in a direction parallel to the interval X.

4. The vapor chamber according to claim 2, wherein the wick structure has a mesh member made of metal, and with first metal wires extending in a first direction and second metal wires extending in a second direction, the metal wires being the fine members forming the wick structure, contact portions between the wick structure and the container and contact portions between the first metal wires and the second metal wires are melted and united.

5. The vapor chamber according to claim 1, wherein a plurality of the welded portions are formed.

6. The vapor chamber according to claim 1, wherein a peripheral portion of the one plate-shaped body that is located outside the cavity portion and a peripheral portion of the other plate-shaped body that is located outside the cavity portion are joined by welding with a fiber laser so that the container is formed.

7. The vapor chamber according to claim 1, wherein the mesh member is a mesh member made of stainless steel.

8. A vapor chamber comprising:
- a container in which a cavity portion is formed by one plate-shaped body and another plate-shaped body facing the one plate-shaped body;
- a working fluid enclosed in the cavity portion; and
- a wick structure contained in the cavity portion and welded to the container so that a welded portion is formed in the wick structure,
wherein
  the wick structure is welded to the container, and thereby contact portions between the wick structure and the container and contact portions between fine members forming the wick structure are melted, and then the wick structure is joined to the container,
  the wick structure extends on an inner surface of the one plate-shaped body in surface contact with the inner surface of the one plate-shaped body, and the working fluid that has undergone a phase change from gas to liquid in a heat discharging portion is circulated from the heat discharging portion to a heat receiving portion only by capillary force of the wick structure, wherein a side surface of the wick structure is located at an interval X from an inner peripheral surface of the container that faces the side surface of the wick structure, and the interval X is greater than 0% and 5% or less of a dimension of the wick structure in a direction parallel to the interval X.

9. The vapor chamber according to claim 8, wherein the wick structure has a mesh member made of metal, and with first metal wires extending in a first direction and second metal wires extending in a second direction, the metal wires being the fine members forming the wick structure, contact portions between the wick structure and the container and contact portions between the first metal wires and the second metal wires are melted and united.

\* \* \* \* \*